US012709820B2

(12) United States Patent
Hyot et al.

(10) Patent No.: US 12,709,820 B2
(45) Date of Patent: Aug. 18, 2026

(54) PROCESS FOR PRODUCING A CRYSTALLINE LAYER

(71) Applicant: COMMISSARIAT A L'ENERGIE ATOMIQUE ET AUX ENERGIES ALTERNATIVES, Paris (FR)

(72) Inventors: Bérangère Hyot, Grenoble (FR); Mathieu Bernard, Grenoble (FR); Stéphane Cadot, Grenoble (FR); Amélie Dussaigne, Grenoble (FR); Rémy Gassilloud, Grenoble (FR); Christine Raynaud, Grenoble (FR); Julien Patouillard, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 13 days.

(21) Appl. No.: 18/969,623

(22) Filed: Dec. 5, 2024

(65) Prior Publication Data

US 2025/0263865 A1 Aug. 21, 2025

(30) Foreign Application Priority Data

Dec. 6, 2023 (FR) ...................................... 2313703

(51) Int. Cl.
*C30B 28/14* (2006.01)
*C30B 29/40* (2006.01)
(Continued)

(52) U.S. Cl.
CPC ............ *C30B 28/14* (2013.01); *C30B 29/403* (2013.01); *C30B 29/406* (2013.01); *C30B 29/68* (2013.01); *C30B 33/00* (2013.01)

(58) Field of Classification Search
CPC ....... C30B 28/14; C30B 33/00; C30B 29/403; C30B 29/406; C30B 29/68
See application file for complete search history.

(56) References Cited

U.S. PATENT DOCUMENTS 11,398,562 B2 * 7/2022 Lin ........................ H10N 50/20
2015/0137075 A1 * 5/2015 Heo ...................... H10D 99/00
257/29

(Continued)

FOREIGN PATENT DOCUMENTS

FR 3 105 591 A1 6/2021
TW 180732 * 7/2023

OTHER PUBLICATIONS

Yang et al, "First princples study on modulation electronic and optical properties of h BN intercalation in ALN/MoS2 heterostructure" Nanotechnology 33 2022 pp. 1-10.*

(Continued)

*Primary Examiner* — Robert M Kunemund
(74) *Attorney, Agent, or Firm* — Oblon, McClelland, Maier & Neustadt, L.L.P.

(57) ABSTRACT

A method for manufacturing a crystal layer includes using a substrate having a surface film made of a dichalcogenide of a transition metal, designated $MX_2$, where "M" denotes a transition metal and "X" denotes a chalcogen, the surface film including a set of monolayers bonded together by van der Waals bonds; forming a polycrystalline aluminium nitride AlN film, having grain boundaries, on the surface film; and diffusing metal elements into the surface film, through the grain boundaries of the polycrystalline aluminium nitride AlN film, the metal elements being chosen to react chemically with $MX_2$ by a redox reaction so as to convert the van der Waals bonds into covalent bonds. A crystalline layer is formed on the polycrystalline aluminium nitride AlN film after the diffusing.

13 Claims, 5 Drawing Sheets

(51) Int. Cl.
*C30B 29/68* (2006.01)
*C30B 33/00* (2006.01)

(56) References Cited

U.S. PATENT DOCUMENTS

| | | | | |
|---|---|---|---|---|
| 2017/0250075 | A1* | 8/2017 | Caymax | H10P 14/3436 |
| 2018/0072947 | A1* | 3/2018 | Pickett | C09K 11/681 |
| 2021/0193907 | A1 | 6/2021 | Cadot et al. | |
| 2021/0391467 | A1* | 12/2021 | Song | H10D 30/6215 |
| 2023/0046307 | A1 | 2/2023 | Wang | |
| 2023/0088634 | A1* | 3/2023 | Lin | H10D 30/675<br>257/288 |

OTHER PUBLICATIONS

Zhang et al "Novel heterostructures by stacking layered molybdenum disulfides and nitrides for solar energy conversion", Journal of material chemistry A volo 2 2014 15389-15395.*

Preliminary French Search Report issued Jul. 1, 2024 in French Application 2313703 filed on Dec. 6, 2023, 8 pages (with English Translation of Categories of Cited Documents & Written Opinion).

* cited by examiner

PROCESS FOR PRODUCING A CRYSTALLINE LAYER

TECHNICAL FIELD

The invention relates to the technical field of the manufacture of a crystalline layer which is thick (i.e. of greater than 200 nm), in particular made of aluminium nitride AlN and of high crystalline quality.

The invention finds its application notably in the production of electronic power devices, or also in the production of acoustic filters for RF (radiofrequency) signals.

STATE OF THE ART

A method known from the state of the art, notably from the document FR 3 105 591 A1, for the manufacture of a crystalline layer comprises the stages:

- A) using a substrate, for example made of silicon, coated with a dielectric layer (e.g. oxide, § 0037);
- B) forming a surface film on the substrate coated with the dielectric layer, the surface film being made of a dichalcogenide of a transition metal, designated $MX_2$, where "M" denotes a transition metal and "X" denotes a chalcogen;
- C) forming a crystalline layer of aluminium nitride AlN on the surface film.

The direct formation of a crystalline layer of aluminium nitride AlN on the dielectric layer (quasi-amorphous surface) results in a layer of poor crystalline quality.

The fact of inserting such a surface film, which acts as a nucleation layer, between the dielectric layer and the aluminium nitride AlN crystalline layer makes it possible to improve the crystalline quality of the aluminium nitride AlN layer formed, because the crystal lattice mismatch between the surface film and the aluminium nitride AlN layer is typically less than or equal to 1.5%.

However, such a method of the prior art is not entirely satisfactory in so far as the formation of a thick aluminium nitride AlN crystalline layer (of greater than 200 nm), necessary for the manufacture of components such as acoustic filters, is liable to result in delamination of the crystalline layer.

DESCRIPTION OF THE INVENTION

The invention is targeted at overcoming all or some of the abovementioned disadvantages. To this end, a subject-matter of the invention is a method for the manufacture of a crystalline layer, comprising the stages:

- a) using a substrate comprising a surface film made of a dichalcogenide of a transition metal, designated $MX_2$, where "M" denotes a transition metal and "X" denotes a chalcogen, the surface film comprising a set of monolayers bonded together by van der Waals bonds;
- b) forming a polycrystalline aluminium nitride AlN film, having grain boundaries, on the surface film;
- c) diffusing metal elements into the surface film, through the grain boundaries of the polycrystalline aluminium nitride AlN film, the metal elements being chosen to react chemically with $MX_2$ by a redox reaction so as to convert the van der Waals bonds into covalent bonds;
- d) forming a crystalline layer on the polycrystalline aluminium nitride AlN film after stage c).

Thus, such a method according to the invention allows the formation of a thick crystalline layer (of greater than 200 nm) while greatly reducing the risks of delamination of the crystalline layer by virtue of stages b) and c). In other words, the chemical transformation of the surface film obtained by reducing the $MX_2$ makes it possible to avoid the risks of delamination of the crystalline layer formed during stage d).

The method according to the invention can comprise one or more of the following characteristics.

According to one characteristic of the invention, stage c) is preceded by exposure of the metal elements on the polycrystalline aluminium nitride AlN film.

Thus, an advantage provided is that of reducing the operation time (process time) by dispensing with a deposition of a material comprising the metal elements.

According to one characteristic of the invention, stage c) is preceded by formation of a material, comprising the metal elements, on the polycrystalline aluminium nitride AlN film.

Thus, an advantage provided is the ease of execution compared with direct exposure of the metal elements, which may require more advanced techniques.

According to one characteristic of the invention, stage d) is preceded by removal of the residues of the material which is formed on the polycrystalline aluminium nitride AlN film, after the diffusion of the metal elements into the surface film on conclusion of stage c).

Thus, an advantage provided is that of facilitating the formation of the crystalline layer by epitaxial growth on the polycrystalline aluminium nitride AlN film and of increasing the crystalline quality.

According to one characteristic of the invention, the metal elements diffused during stage c) are atoms chosen as reducing agent for the $MX_2$.

Thus, an advantage provided is that of obtaining a chemical reaction with $MX_2$ (redox reaction) so as to convert the van der Waals bonds into covalent bonds.

According to one characteristic of the invention, stage a) is carried out so that $MX_2$ is chosen to have a crystal lattice mismatch with the polycrystalline aluminium nitride AlN of less than or equal to 1.5%.

Thus, an advantage provided is that of obtaining a satisfactory crystalline quality for the polycrystalline aluminium nitride AlN.

According to one characteristic of the invention, stage a) is carried out so that $MX_2$ is chosen from molybdenum disulfide $MoS_2$, tungsten disulfide $WS_2$ or vanadium disulfide $VS_2$.

Thus, an advantage provided by such materials is their crystalline (i.e. hexagonal) symmetry compatible with aluminium nitride AlN, and also a small crystal lattice mismatch with aluminium nitride AlN.

According to one characteristic of the invention:

- stage a) is carried out so that $MX_2$ is molybdenum disulfide $MoS_2$;
- the atoms chosen as reducing agent for molybdenum disulfide $MoS_2$ are chosen from gallium Ga, aluminium Al or manganese Mn.

According to one characteristic of the invention, stage d) is carried out so that the crystalline layer is made of a crystalline material having a crystal lattice mismatch with the polycrystalline aluminium nitride AlN of less than or equal to 1.5%.

Thus, an advantage provided is that of obtaining a satisfactory crystalline quality for the crystalline layer.

According to one characteristic of the invention, stage d) is carried out so that the crystalline layer is made of a crystalline material chosen from silicon carbide SIC and an alloy of III-N type.

Thus, an advantage provided by these materials is their small lattice mismatch with the polycrystalline aluminium nitride AlN.

According to one characteristic of the invention, the alloy of III-N type is chosen from aluminium nitride AlN, gallium nitride GaN or aluminium-gallium nitride AlGaN.

Thus, an advantage provided by these materials is their small lattice mismatch (indeed even zero mismatch for aluminium nitride AlN) with the polycrystalline aluminium nitride AlN.

According to one characteristic of the invention, stage b) is carried out so that the polycrystalline aluminium nitride AlN film exhibits a thickness of less than or equal to 5 nm.

Thus, an advantage provided is that of facilitating the diffusion of the metal elements within it in order to reach the underlying $MX_2$ film.

According to one characteristic of the invention, stage b) is carried out by physical vapour deposition.

According to one characteristic of the invention, stage d) is carried out by physical vapour deposition or by organometallic vapour epitaxy.

Organometallic vapour epitaxy, carried out at high temperature (of greater than 950° C.), makes it possible to obtain a better crystalline quality (increase in the size of the grains) compared with physical vapour deposition.

According to one characteristic of the invention, stage d) is carried out so that the crystalline layer exhibits a thickness of greater than or equal to 200 nm.

Thus, an advantage provided is that of allowing the manufacture of components such as acoustic filters.

Another subject-matter of the invention is a stack, comprising:

- a substrate comprising a surface film made of a dichalcogenide of a transition metal, designated $MX_2$, where "M" denotes a transition metal and "X" denotes a chalcogen, the surface film comprising metal elements suitable for reacting chemically with $MX_2$ by a redox reaction, the surface film comprising a set of monolayers bonded together by covalent bonds;
- a polycrystalline aluminium nitride AlN film, having grain boundaries, and extending over the surface film.

Finally, a subject-matter of the invention is a device, comprising:

- stack according to the invention;
- a crystalline layer, extending over the polycrystalline aluminium nitride AlN film.

Definitions

The term "crystalline" is understood to mean a solid, the constituents of which are assembled in a regular manner. In other words, the diffraction pattern is essentially discrete, in accordance with the definition officially given by the International Union of Crystallography (IUCR). The solid can be monocrystalline or polycrystalline but not amorphous.

The term "substrate" is understood to mean a self-supporting physical support. A substrate can be a wafer, which is generally provided in the form of a disc resulting from cutting from an ingot of a crystalline material. The substrate can be coated with a dielectric layer, for example via deposition of a dedicated dielectric layer or via oxidation of the substrate.

The term "crystal lattice mismatch" is understood to mean the quantitative difference between the lattice parameters of the materials concerned.

The term "alloy of III-N type" is understood to mean an alloy between at least one element located in column III of the Periodic Table of the Elements (PTE) and the element nitrogen N. By way of non-limiting example, the alloy can be binary in the presence of a single element from column III of the PTE and nitrogen N. The alloy can be ternary in the presence of two elements from column III of the PTE and nitrogen N, and the like.

The term "thickness" is understood to mean the dimension along the normal to the surface of the substrate on which the surface film is formed.

BRIEF DESCRIPTION OF THE DRAWINGS

Other characteristics and advantages will become apparent in the detailed description of various embodiments of the invention, the description being accompanied by examples and by references to the attached drawings.

Figure 1:
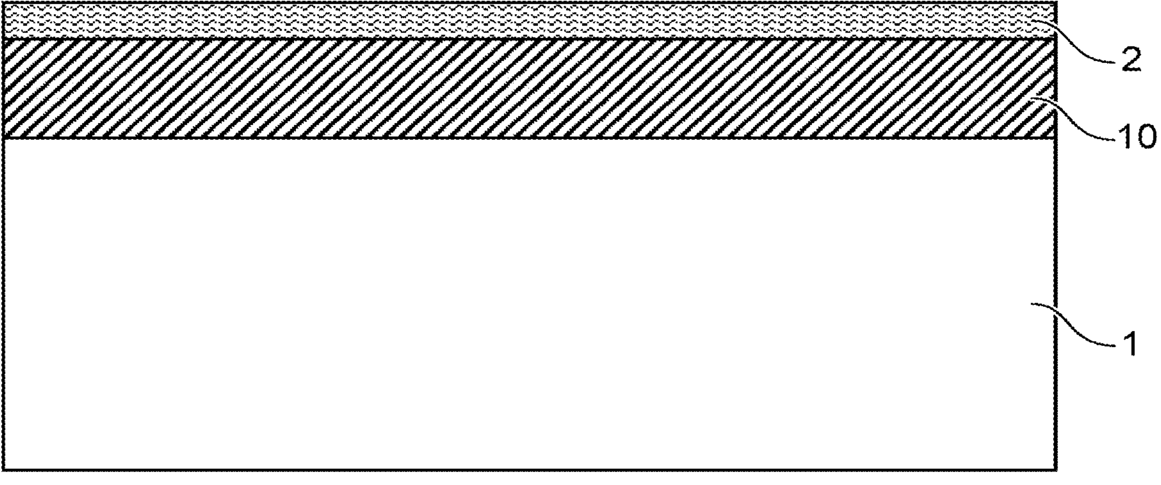
FIG. 1 is a diagrammatic sectional view illustrating a stage a) of a method according to the invention.
Figure 2:
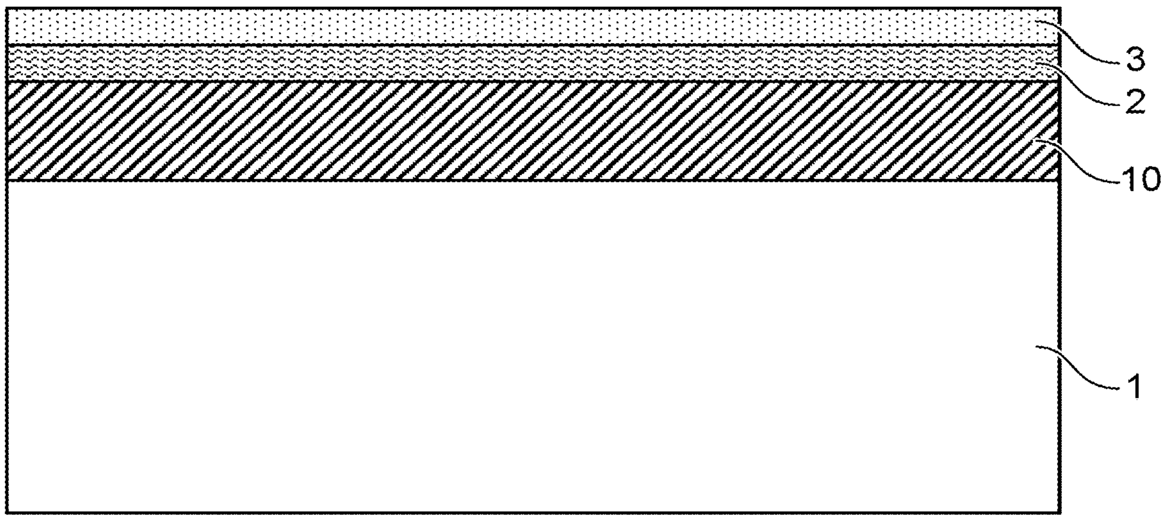
FIG. 2 is a diagrammatic sectional view illustrating a stage b) of a method according to the invention.
Figure 3:
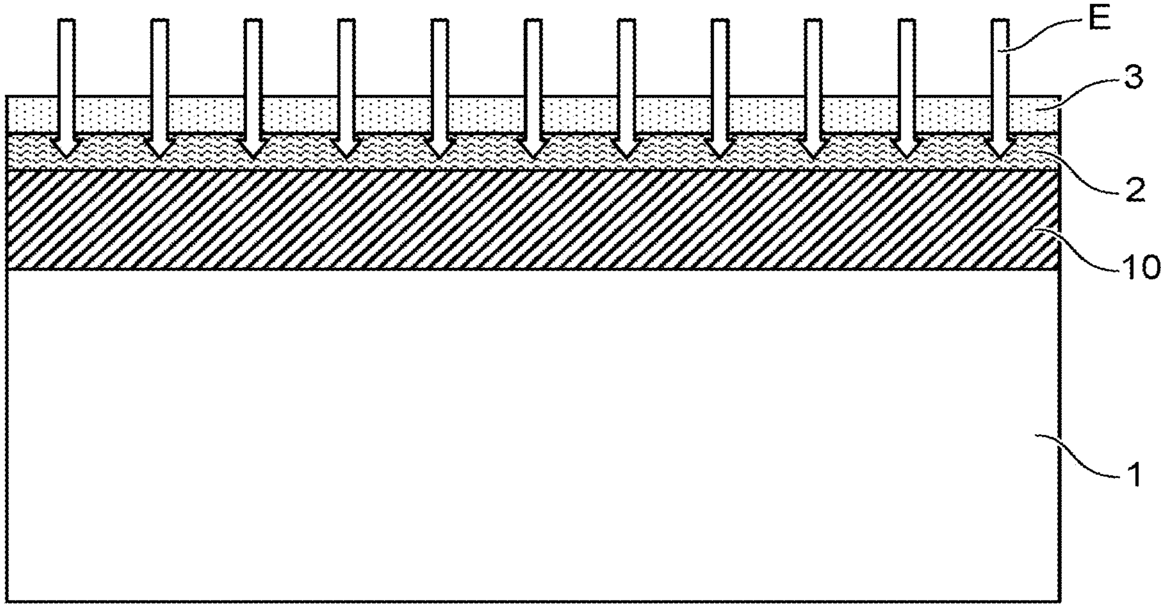
FIG. 3 is a diagrammatic sectional view illustrating a first embodiment of a stage c) of a method according to the invention, that is to say (direct) exposure of the metal elements on the polycrystalline aluminium nitride AlN film, which diffuse into the surface film.
Figure 4:
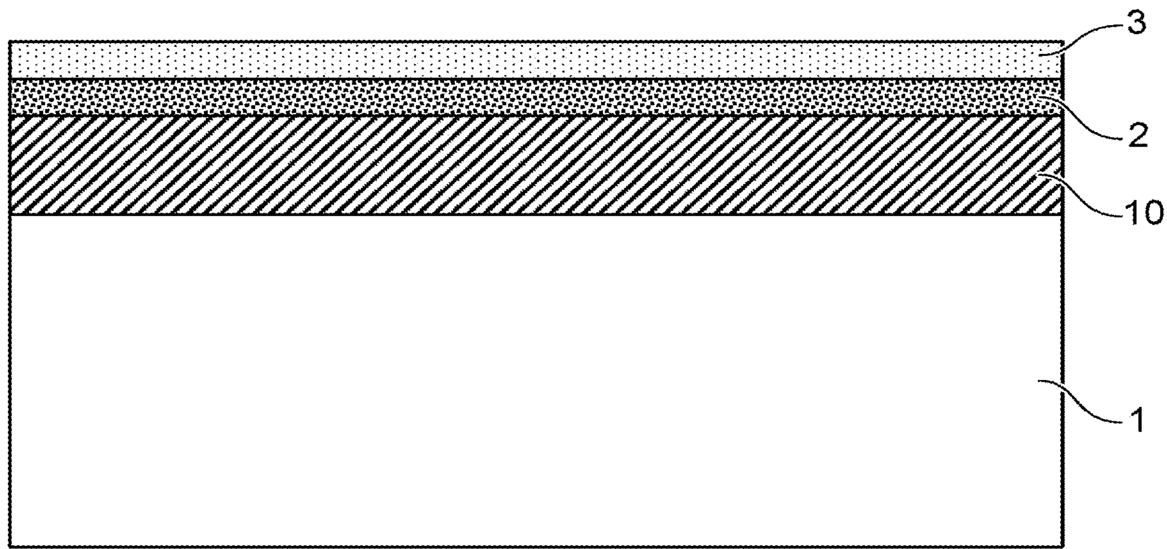
FIG. 4 is a diagrammatic sectional view illustrating the outcome of stage c) of FIG. 3 with the transformation of the van der Waals bonds into covalent bonds in the surface film.
Figure 5:
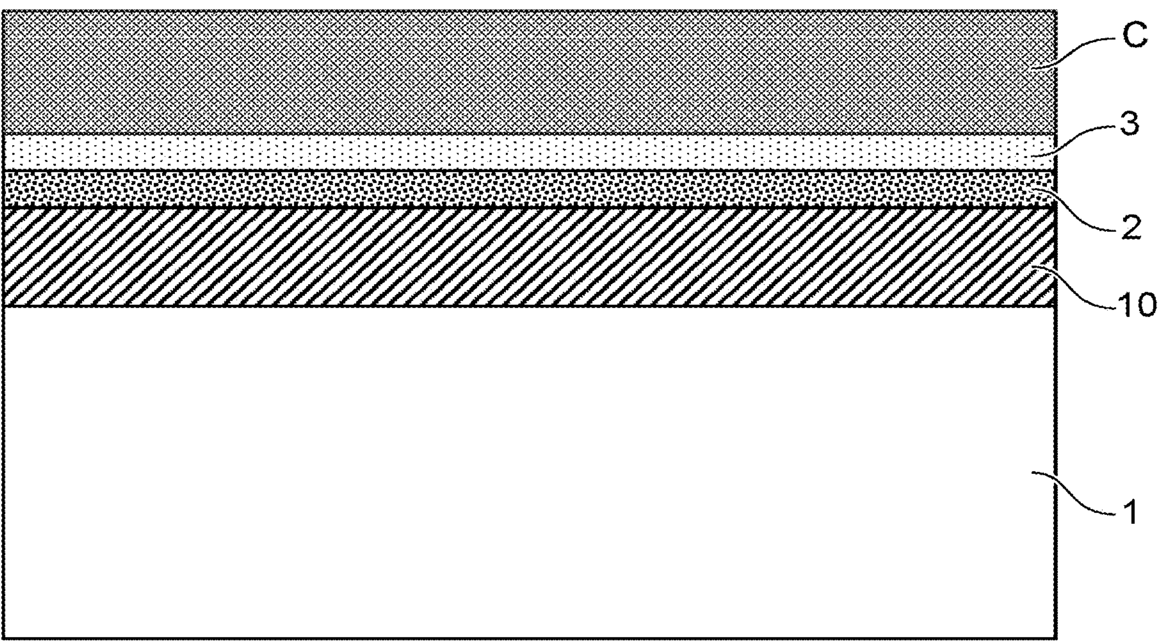
FIG. 5 is a diagrammatic sectional view illustrating a stage d) of a method according to the invention carried out on conclusion of stage c) illustrated in FIG. 4.
Figure 6:
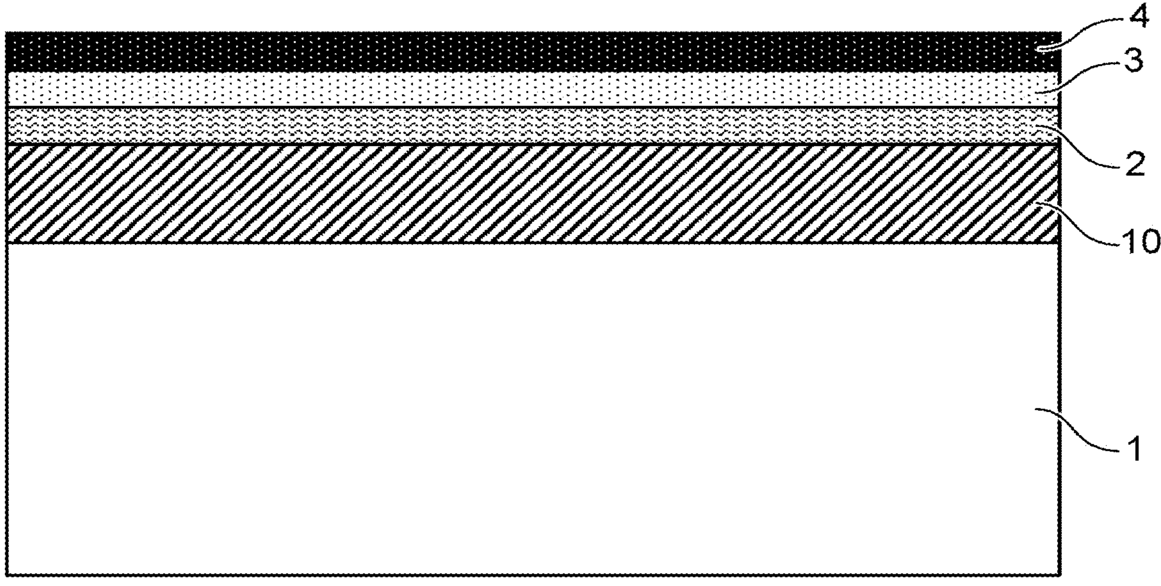
FIG. 6 is a diagrammatic sectional view illustrating a second embodiment of a stage c) of a method according to the invention, that is to say the formation of a material, comprising the metal elements, on the polycrystalline aluminium nitride AlN film.
Figure 7:
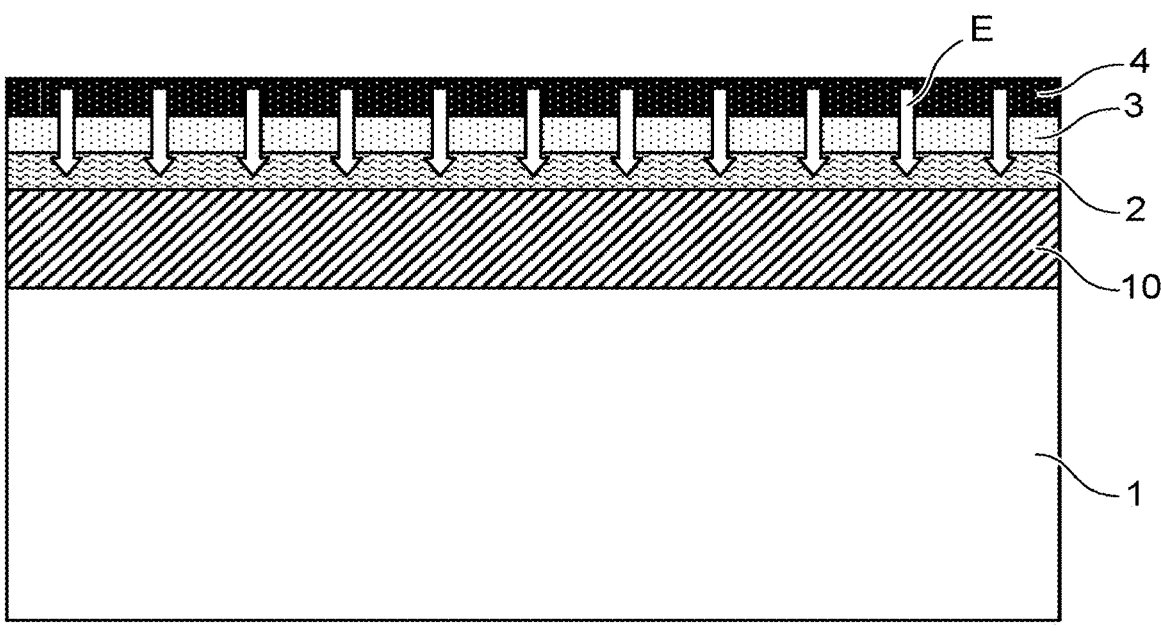
FIG. 7 is a diagrammatic sectional view illustrating the diffusion of the metal elements from the material illustrated in FIG. 6 to the surface film, via the polycrystalline aluminium nitride AlN film.
Figure 8:
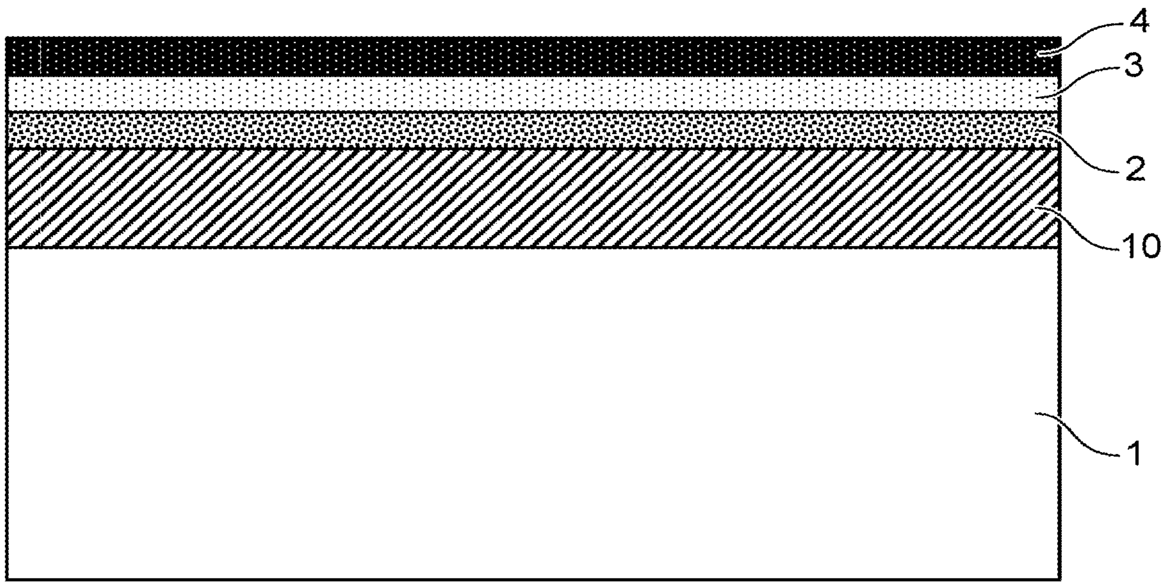
FIG. 8 is a diagrammatic sectional view illustrating the outcome of stage c) of FIG. 7 with the transformation of the van der Waals bonds into covalent bonds in the surface film.
Figure 9:
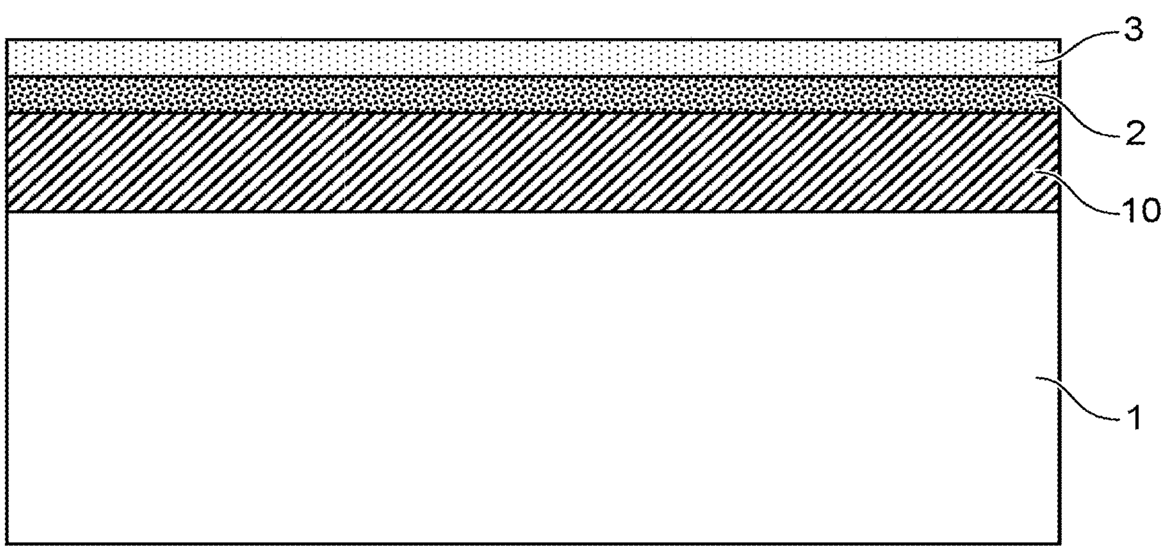
FIG. 9 is a diagrammatic sectional view illustrating removal of the residues of the material which is formed on the polycrystalline aluminium nitride AlN film, on conclusion of stage c) illustrated in FIG. 8.
Figure 10:
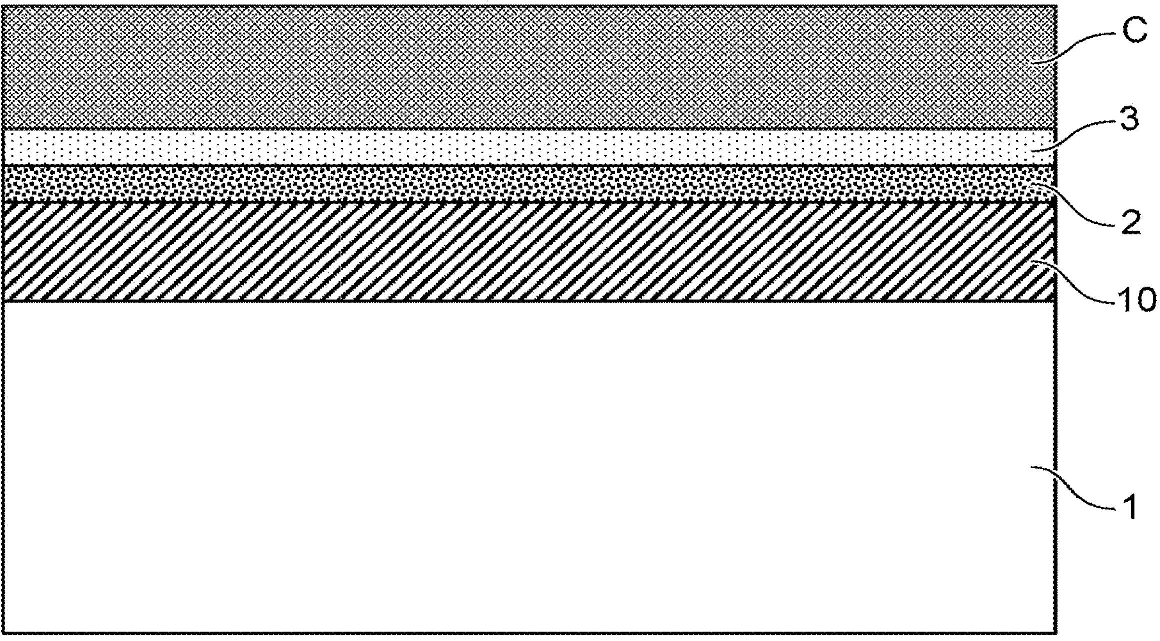
FIG. 10 is a diagrammatic sectional view illustrating a stage d) of a method according to the invention carried out after the removal of the residues which is illustrated in FIG. 9.

It should be noted that the drawings described above are diagrammatic and are not necessarily to scale for the sake of readability and in order to simplify the understanding thereof. The cuts are made along the normal to the surface of the substrate on which the surface film is formed.

DETAILED ACCOUNT OF THE EMBODIMENTS

Elements which are identical or perform the same function will carry the same references for the different embodiments, for the sake of simplification.

A subject-matter of the invention is a method for the manufacture of a crystalline layer C, comprising the stages:

a) using a substrate 1 comprising a surface film 2 made of a dichalcogenide of a transition metal, designated $MX_2$, where "M" denotes a transition metal and "X" denotes a chalcogen, the surface film 2 comprising a set of monolayers bonded together by van der Waals bonds;

b) forming a polycrystalline aluminium nitride AlN film 3, having grain boundaries, on the surface film 2;

c) diffusing metal elements E into the surface film 2, through the grain boundaries of the polycrystalline aluminium nitride AlN film 3, the metal elements E being chosen to react chemically with $MX_2$ by a redox reaction so as to convert the van der Waals bonds into covalent bonds;

d) forming a crystalline layer C on the polycrystalline aluminium nitride AlN film 3 after stage c).

Stage a)

Stage a) consists in using a substrate 1 comprising a surface film 2 made of a dichalcogenide of a transition metal, designated $MX_2$, where "M" denotes a transition metal and "X" denotes a chalcogen. The transition metal "M" can be chosen from titanium Ti, zirconium Zr, hafnium Hf, vanadium V, niobium Nb, tantalum Ta, chromium Cr, molybdenum Mo, tungsten W or rhenium Re. The chalcogen "X" can be chosen from sulfur S, selenium Se or tellurium Te.

The substrate 1 can be coated with a dielectric layer 10. By way of non-limiting example, the substrate 1 can be made of silicon and the dielectric layer 10 can be made of silicon dioxide $SiO_2$. Such a dielectric layer 10 is particularly suitable for the formation of the surface film 2 of $MX_2$, for example by atomic layer deposition or by organometallic vapour epitaxy. Atomic layer deposition, which can be carried out at low temperature (of less than 300° C.), is advantageous compared with other techniques, such as organometallic vapour epitaxy or chemical vapour deposition.

The surface film 2 comprises a set of monolayers bonded together by van der Waals bonds. By way of non-limiting example, the surface film 2 can exhibit a thickness of 2 nm. The number of monolayers is advantageously less than or equal to 50.

Stage a) is advantageously carried out so that $MX_2$ is chosen to have a crystal lattice mismatch with the polycrystalline aluminium nitride AlN of less than or equal to 1.5%. Stage a) is advantageously carried out so that $MX_2$ is chosen from molybdenum disulfide $MoS_2$, tungsten disulfide $WS_2$ or vanadium disulfide $VS_2$.

The surface film 2 of $MX_2$ makes it possible to orient the crystalline growth of the polycrystalline aluminium nitride AlN film 3 during stage b), more precisely in the direction "c" (vertical axis) of the hexagonal crystal system.

Stage b)

Stage b) consists in forming a polycrystalline aluminium nitride AlN film 3, having grain boundaries, on the surface film 2.

Stage b) is advantageously carried out so that the polycrystalline aluminium nitride AlN film 3 exhibits a thickness of less than or equal to 5 nm. The thickness is advantageously of between 3 nm and 4 nm.

Stage b) is advantageously carried out by physical vapour deposition.

Stage c)

Stage c) consists in diffusing metal elements E into the surface film 2, through the grain boundaries of the polycrystalline aluminium nitride AlN film 3. The diffusion is chemical in nature due to a chemical concentration gradient.

The metal elements E are chosen in order to react chemically with $MX_2$ by a redox reaction so as to convert the van der Waals bonds into covalent bonds. For example, when the chalcogen "X" is sulfur S, the metal elements E make it possible to form metal sulfides $E_xS_y$ at the expense of the initial $MS_2$. "E" denoting the metal making up the metal elements E. The van der Waals bonds of the initial $MS_2$ are converted into covalent bonds of the transition metal "M" and into covalent bonds of the $E_xS_y$.

The metal elements E diffused during stage c) are advantageously atoms chosen as reducing agent for the $MX_2$. When stage a) is carried out so that $MX_2$ is molybdenum disulfide $MoS_2$, then the atoms chosen as reducing agent for molybdenum disulfide $MoS_2$ are advantageously chosen from gallium Ga, aluminium Al or manganese Mn. For example, gallium Ga atoms make it possible to reduce molybdenum disulfide $MoS_2$ in order to form gallium sulfides $Ga_xS_y$ at the expense of the initial molybdenum disulfide $MoS_2$. The van der Waals bonds of the initial molybdenum disulfide $MoS_2$ are converted into covalent bonds of the molybdenum Mo and into covalent bonds of the $Ga_xS_y$ with release of a gallium sulfide GaS in gaseous form.

According to a first embodiment, stage c) is preceded by exposure of the metal elements E on the polycrystalline aluminium nitride AlN film 3. The exposure of the metal elements E on the polycrystalline aluminium nitride AlN film 3 can consist in depositing atoms, chosen as reducing agent for the $MX_2$, on the polycrystalline aluminium nitride AlN film 3. By way of non-limiting examples, the deposition of the atoms on the polycrystalline aluminium nitride AlN film 3 can be carried out by organometallic vapour epitaxy or by molecular beam epitaxy.

According to a second embodiment, stage c) is preceded by formation of a material 4, comprising the metal elements E, on the polycrystalline aluminium nitride AlN film 3. The material 4 is a solid material. The material 4 formed advantageously exhibits a thickness strictly of less than 3 nm. The material 4 can be formed by organometallic vapour epitaxy or by molecular beam epitaxy. When stage a) is carried out so that $MX_2$ is molybdenum disulfide $MoS_2$ and that the atoms chosen as reducing agent for molybdenum disulfide $MoS_2$ are gallium Ga atoms, the material 4 formed can be a thin layer of gallium nitride GaN. By way of non-limiting example, the thin layer of gallium nitride GaN forming the material 4, with a thickness strictly of less than 3 nm, can be obtained by organometallic vapour epitaxy with the following experimental parameters:

temperature of between 800° C. and 1040° C.

atmosphere of $NH_3/N_2$ or $NH_3/H_2$ type, precursor gases chosen from trimethylgallium (TMGa) and triethylgallium (TEGa), pressure of between 150 mbar and 400 mbar.

The diffusion of the metal elements E through the grain boundaries of the polycrystalline aluminium nitride AlN film 3 can be carried out concomitantly with the formation of the material 4, for example by organometallic vapour epitaxy. For example, atoms (forming the metal elements E) which reach the surface of the polycrystalline aluminium nitride AlN film 3 are available to diffuse through the polycrystalline aluminium nitride AlN film 3.

Stage d)

Stage d) consists in forming a crystalline layer C on the polycrystalline aluminium nitride AlN film 3 after stage c).

When stage c) is preceded by formation of a material 4, comprising the metal elements E, on the polycrystalline aluminium nitride AlN film 3, then stage d) is advantageously preceded by removal of the residues of the material 4 which is formed on the polycrystalline aluminium nitride AlN film 3, after the diffusion of the metal elements E into the surface film 2 on conclusion of stage c). By way of non-limiting example, when the material 4 is a thin layer of gallium nitride GaN, the removal of the residues can be carried out by surface cleaning with molecular hydrogen $H_2$ at a pressure of 150 mbar.

Stage d) is advantageously carried out so that the crystalline layer C is made of a crystalline material having a crystal lattice mismatch with the polycrystalline aluminium nitride AlN of less than or equal to 1.5%. Stage d) is advantageously carried out so that the crystalline layer C is made of a crystalline material chosen from silicon carbide SiC and an alloy of III-N type. The alloy of III-N type is advantageously chosen from aluminium nitride AlN, gallium nitride GaN or aluminium-gallium nitride AlGaN.

Stage d) is advantageously carried out by physical vapour deposition or by organometallic vapour epitaxy. In particular, organometallic vapour epitaxy is possible, despite a high temperature which can exceed, for example, 950° C., by virtue of the presence of the polycrystalline aluminium nitride AlN film 3 which makes possible epitaxial regrowth. In the absence of the polycrystalline aluminium nitride AlN film 3, the surface film 2 of $MX_2$ would undergo thermal decomposition.

Stage d) is advantageously carried out so that the crystalline layer C exhibits a thickness of greater than or equal to 200 nm. By way of non-limiting example, the thickness of the crystalline layer C can be of the order of a micron.

A subject-matter of the invention is a stack, comprising:

- a substrate 1 comprising a surface film 2 made of a dichalcogenide of a transition metal, designated $MX_2$, where "M" denotes a transition metal and "X" denotes a chalcogen, the surface film 2 comprising metal elements E suitable for reacting chemically with $MX_2$ by a redox reaction, the surface film 2 comprising a set of monolayers bonded together by covalent bonds;
- a polycrystalline aluminium nitride AlN film 3, having grain boundaries, and extending over the surface film 2.

The substrate 1 can be coated with a dielectric layer 10. By way of non-limiting example, the substrate 1 can be made of silicon and the dielectric layer 10 can be made of silicon dioxide $SiO_2$.

The transition metal "M" can be chosen from titanium Ti, zirconium Zr, hafnium Hf, vanadium V, niobium Nb, tantalum Ta, chromium Cr, molybdenum Mo, tungsten W or rhenium Re. The chalcogen "X" can be chosen from sulfur S, selenium Se or tellurium Te. $MX_2$ is advantageously chosen to have a crystal lattice mismatch with the polycrystalline aluminium nitride AlN of less than or equal to 1.5%. $MX_2$ is advantageously chosen from molybdenum disulfide $MoS_2$, tungsten disulfide $WS_2$ or vanadium disulfide $VS_2$.

For example, when the chalcogen "X" is sulfur S, the metal elements E form metal sulfides $E_xS_y$ at the expense of the initial $MS_2$. "E" denoting the metal making up the metal elements E. The metal elements E are advantageously atoms chosen as reducing agent for the $MX_2$. When $MX_2$ is molybdenum disulfide $MoS_2$, then the atoms chosen as reducing agent for molybdenum disulfide $MoS_2$ are advantageously chosen from gallium Ga, aluminium Al or manganese Mn. For example, gallium Ga atoms make it possible to reduce molybdenum disulfide $MoS_2$ in order to form gallium sulfides $Ga_xS_y$ at the expense of the initial molybdenum disulfide $MoS_2$.

By way of non-limiting example, the surface film 2 can exhibit a thickness of 2 nm. The number of monolayers is advantageously less than or equal to 50.

The polycrystalline aluminium nitride AlN film 3 advantageously exhibits a thickness of less than or equal to 5 nm. The thickness is advantageously of between 3 nm and 4 nm. The polycrystalline aluminium nitride AlN film 3 can comprise the metal elements E in residual proportion.

A subject-matter of the invention is a device, comprising:

- a stack according to the invention;
- a crystalline layer C, extending over the polycrystalline aluminium nitride AlN film 3.

The crystalline layer C is advantageously made of a crystalline material having a crystal lattice mismatch with the polycrystalline aluminium nitride AlN of less than or equal to 1.5%. The crystalline layer C is advantageously made of a crystalline material chosen from silicon carbide SiC and an alloy of III-N type. The alloy of III-N type is advantageously chosen from aluminium nitride AlN, gallium nitride GaN or aluminium-gallium nitride AlGaN.

The crystalline layer C advantageously exhibits a thickness of greater than or equal to 200 nm. By way of non-limiting example, the thickness of the crystalline layer C can be of the order of a micron.

By way of non-limiting examples, the device can be an electronic power device or an acoustic filter for RF (radiofrequency) signals.

The Invention is not limited to the embodiments described. A person skilled in the art is put in a position to consider their technically effective combinations and to substitute equivalents for them.

The invention claimed is:

1. A method for manufacturing a crystalline layer, comprising:

a) using a substrate comprising a surface film made of a dichalcogenide of a transition metal, designated $MX_2$, where "M" denotes a transition metal and "X" denotes a chalcogen, the surface film comprising a set of monolayers bonded together by van der Waals bonds;

b) forming a polycrystalline aluminium nitride AlN film, having grain boundaries on the surface film;

c) diffusing metal elements into the surface film, through the grain boundaries of the polycrystalline aluminium nitride AlN film, the metal elements being chosen to react chemically with $MX_2$ by a redox reaction so as to convert the van der Waals bonds into covalent bonds; and d) forming a crystalline layer on the polycrystalline aluminium nitride AlN film after stage c).

2. The method according to claim 1, wherein c) is preceded by exposing the metal elements on the polycrystalline aluminium nitride AlN film.

3. The method according to claim 1, wherein c) is preceded by forming a material, comprising the metal elements, on the polycrystalline aluminium nitride AlN film.

4. The method according to claim 3, d) is preceded by removing residues of the material which are formed on the polycrystalline aluminium nitride AlN film, after the diffusion of the metal elements into the surface film on conclusion of c).

5. The method according to claim 1, wherein the metal elements diffused during c) are atoms chosen as a reducing agent for the $MX_2$.

6. The method according to claim 1, wherein a) is carried out so that $MX_2$ is chosen to have a crystal lattice mismatch with the polycrystalline aluminium nitride AlN of less than or equal to 1.5%.

7. The method according to claim 6, wherein a) is carried out so that $MX_2$ is chosen from molybdenum disulfide $MoS_2$, tungsten disulfide $WS_2$ or vanadium disulfide $VS_2$.

8. The method according to claim 7, wherein a) is carried out so that $MX_2$ is molybdenum disulfide $MoS_2$; the method further comprising:

the metal elements diffused during c) are atoms chosen as a reducing agent for molybdenum disulfide $MoS_2$, the atoms being chosen from gallium Ga, aluminium Al or manganese Mn.

9. The method according to claim 1, wherein d) is carried out so that the crystalline layer is made of a crystalline material having a crystal lattice mismatch with the polycrystalline aluminium nitride AlN of less than or equal to 1.5%.

10. The method according to claim 1, wherein d) is carried out so that the crystalline layer is made of a crystalline material chosen from silicon carbide SiC and an alloy of III-N type.

11. The method according to claim 10, in which the alloy of III-N type is chosen from aluminium nitride AlN, gallium nitride GaN or aluminium-gallium nitride AlGaN.

12. The method according to claim 1, wherein b) is carried out so that the polycrystalline aluminium nitride AlN film exhibits a thickness of less than or equal to 5 nm.

13. The method according to claim 1, wherein d) is carried out so that the crystalline layer exhibits a thickness of greater than or equal to 200 nm.

* * * * *